(12) United States Patent
Hsieh et al.

(10) Patent No.: US 8,231,405 B2
(45) Date of Patent: Jul. 31, 2012

(54) CONNECTOR ASSEMBLY

(75) Inventors: Chung-Cheng Hsieh, Taipei Hsien (TW); Chien-Fa Huang, Taipei Hsien (TW); Li-Ping Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 44 days.

(21) Appl. No.: 12/900,618

(22) Filed: Oct. 8, 2010

(65) Prior Publication Data
US 2011/0281457 A1 Nov. 17, 2011

(30) Foreign Application Priority Data

May 11, 2010 (CN) .......................... 2010 1 0169289

(51) Int. Cl.
*H01R 13/73* (2006.01)
(52) U.S. Cl. ....................................... 439/573; 439/374

(58) Field of Classification Search .................. 361/742, 361/758, 770, 804; 439/573, 374
See application file for complete search history.

(56) References Cited

U.S. PATENT DOCUMENTS

| | | | | |
|---|---|---|---|---|
| 5,825,633 A * | 10/1998 | Bujalski et al. | ................ | 361/804 |
| 6,290,536 B1 * | 9/2001 | Hwang et al. | ................. | 439/553 |
| 6,831,839 B2 * | 12/2004 | Bovell | ........... | 361/742 |
| 6,869,304 B2 * | 3/2005 | Groebe et al. | ................ | 439/341 |
| 6,890,200 B1 * | 5/2005 | Wu | ............................... | 439/247 |
| 6,923,679 B1 * | 8/2005 | Wu | ............................... | 439/573 |
| 2005/0101184 A1 * | 5/2005 | Chang et al. | .................. | 439/564 |
| 2005/0282421 A1 * | 12/2005 | Margulis et al. | .............. | 439/247 |

* cited by examiner

*Primary Examiner* — Briggitte R Hammond
(74) *Attorney, Agent, or Firm* — Altis Law Group, Inc.

(57) ABSTRACT

A connector assembly includes a resilient mounting panel and a connector. The resilient mounting panel includes a panel body and a mounting protrusion. The connector includes a connector body and a mounting portion extending from the connector body. The connector body is configured to connect to an electronic device, and the mounting portion is configured to be secured to the mounting protrusion and to space the connector from the panel body.

13 Claims, 3 Drawing Sheets

CONNECTOR ASSEMBLY

BACKGROUND

1. Technical Field

The present disclosure relates to connector assemblies.

2. Description of Related Art

A conventional computer system usually includes a lot of connectors in a computer case. The installation of the connectors in the computer case usually involves the use of screws. An electronic device, such as a disk drive, connects to a connector. A receiving opening is defined in the disk drive corresponding to the connector. The connector may go out of alignment over time and/or after repeated use. It will then become difficult to use.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
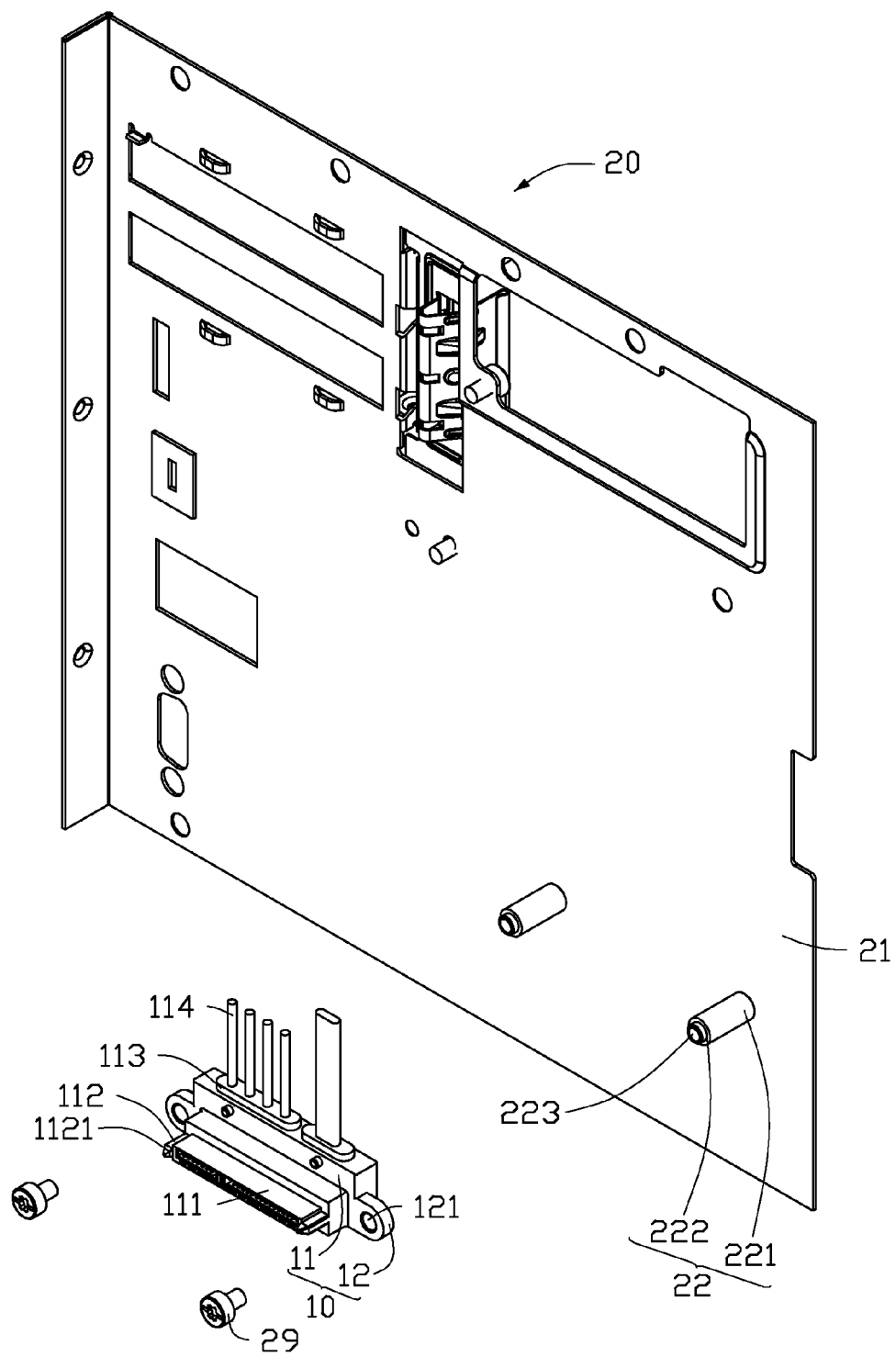
FIG. 1 is an exploded, isometric view of a connector assembly of an embodiment.

Referring to FIG. 1, a connector assembly includes a connector 10 and a resilient mounting panel 20.

The connector 10 includes a connector body 11 and two mounting portions 12 extending from opposite sides of the connector body 11.

The connector body 11 includes an inserting terminal 111 and two guiding portions 112 extending from opposite sides of the inserting terminal 111. Each guiding portion 112 includes a subulate head 1121. The connector body 11 further includes a connecting terminal 113 configured to connect to a cable 114. The inserting terminal 111 is configured to connect to the inserting opening 31 in a first direction. The connecting terminal 113 is configured to connect to the cable 114 in a second direction that is substantially perpendicular to the first direction. The first direction is substantially perpendicular to the panel body 21. A circular through hole 121 is defined in each mounting portion 12.

The resilient mounting panel 20 includes a panel body 21 and two mounting protrusions 22 extending perpendicularly from the panel body 21. Each mounting protrusion 22 includes a columned protrusion body 221 and a columned positioning portion 222 extending from the protrusion body 221. Diameter of the through hole 121 of the connector 10 is less than the width of the protrusion body 221 in cross section taken along a plane parallel to the resilient mounting panel 20, but greater than the width of the positioning portion 222 in cross section taken along the plane parallel to the resilient mounting panel 20. A circular securing hole 223 is defined in the positioning portion 222.

In assembly, the through holes 121 are respectively aligned with the securing holes 223 of the mounting protrusions 22 of the resilient mounting panel 20. The positioning portions 222 are aligned with and extend through the through holes 121. Two securing elements 29, such as screws, respectively extend through the through holes 121 to be screwed into the securing holes 223, thereby securing the connector 10 to the resilient mounting panel 20.

Figure 2:
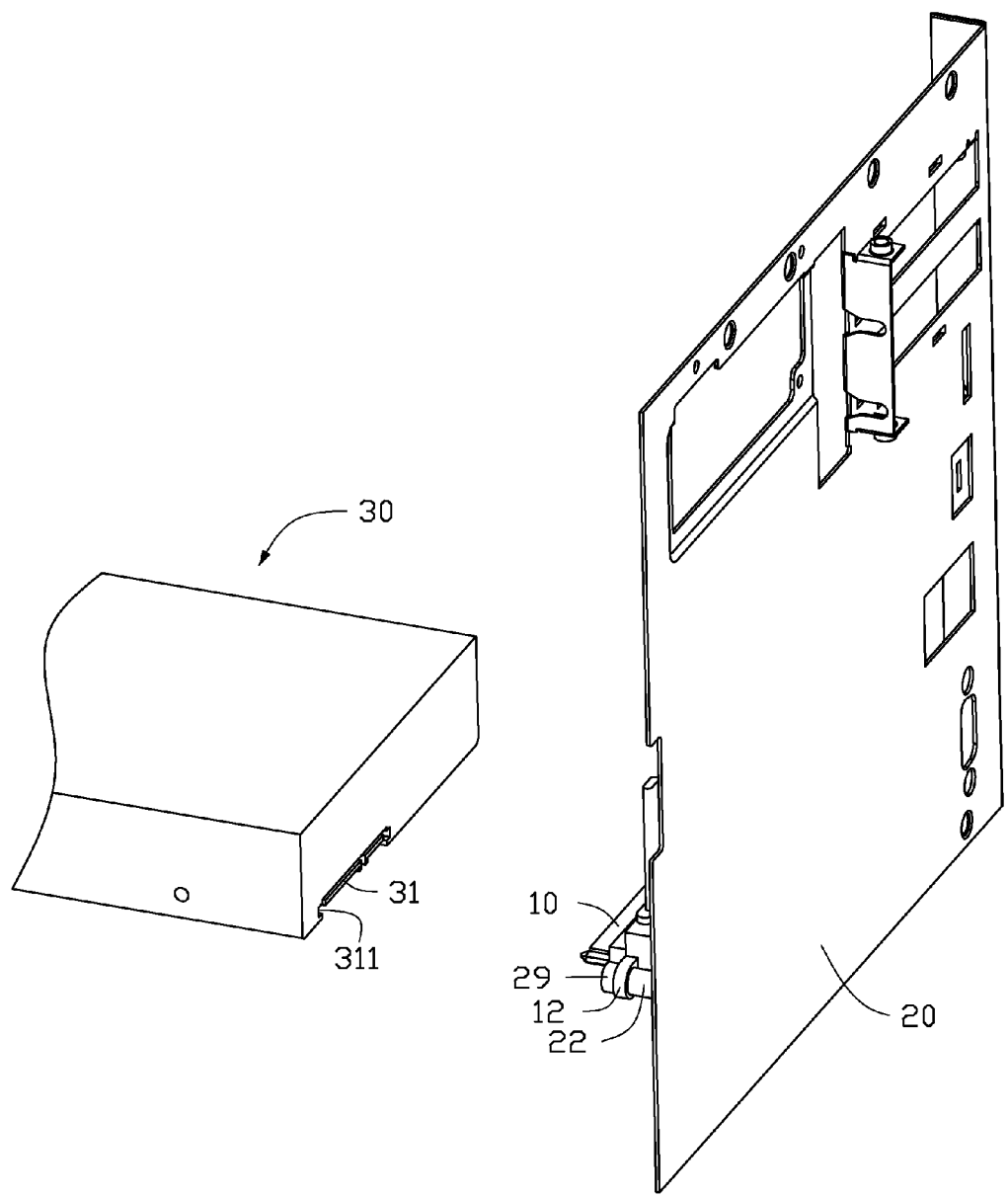
FIG. 2 is an exploded, isometric view of the connector assembly of FIG. 1 and a disk drive.
Figure 3:
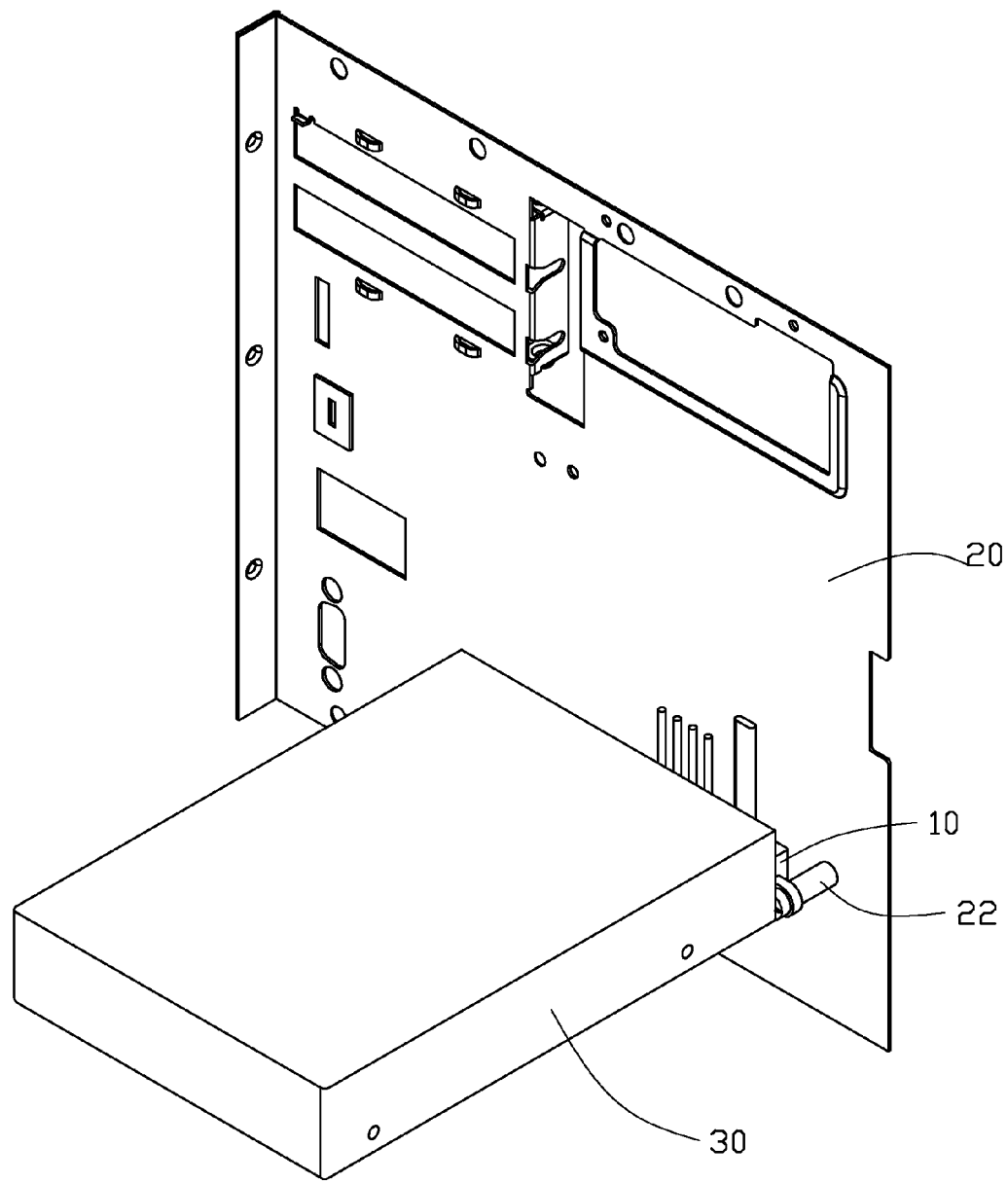
FIG. 3 is an assembled view of FIG. 2.

Referring to FIGS. 2 and 3, the connector 10 is configured to be connected to a disk drive 30.

An inserting opening 31 is defined in the disk drive 30 corresponding to the inserting terminal 111 of the connector 10. Two guiding cutouts 311 are defined in opposite sides of the inserting opening 31. That corresponds to the guiding portions 112 of the connector 10. In assembly of the disk drive 30 to the connector 10, the heads 1121 are received in the cutouts 311. At this time, the inserting terminal 111 of the connector 10 is received in the inserting opening 31.

During the process of the connector 10 connecting to the disk drive 30, if the inserting opening 31 of the disk drive 30 is not aligned adequately with the inserting terminal 111 of the connector 10, the disk drive 30 abuts against the connector 10. The disk drive 30 forces the connector 10 into alignment. The connector 30 is adjusted to enable the inserting terminal 111 of the connector 10 to be aligned with the inserting opening 31. Thereby the inserting terminal 111 is easily received in the inserting opening 31 of the disk drive 30 even after repeated use.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An apparatus, comprising:
   a resilient mounting panel, the resilient mounting panel comprising a panel body and a mounting protrusion; and
   a connector, the connector comprising a connector body and a mounting portion extending from the connector body; the connector body is configured to connect to an electronic device, and the mounting portion is configured to be secured to the mounting protrusion and to space the connector from the panel body;
   wherein a securing hole is defined in the mounting protrusion, and a through hole is defined in the mounting portion; a securing element is screwed into the through hole and the securing hole to secure the connector to the mounting protrusion; the mounting protrusion comprises a protrusion body extending from the panel body and a positioning portion extending from the protrusion body; the securing hole is defined in the positioning portion; a cross section of the positioning portion is less than that of the protrusion body; and the positioning portion is received in the through hole and an edge of the through hole contacts the protrusion body.

2. The apparatus of claim 1, wherein the resilient mounting panel further comprises a second mounting protrusion, and the connector further comprises a second mounting portion corresponding to the second mounting protrusion; and the mounting protrusion and the second mounting protrusion are disposed on opposite sides of the connector body.

3. The apparatus of claim 1, wherein the connector body is configured to connect to the electronic device in a direction substantially parallel to the panel body.

4. The apparatus of claim 1, wherein the connector body comprises a connecting terminal; the connecting terminal is configured to connect to a cable in a first direction, and the connector body is configured to connect to the electronic device in a second direction that is substantially perpendicular to the first direction.

5. The apparatus of claim 1, wherein the connector body comprises an inserting terminal configured to connect to the electronic device, and two guiding portions extending from two opposite sides of the inserting terminal; and each guiding portion is configured to guide the inserting terminal to connect to the electronic device.

6. The apparatus of claim 5, wherein each guiding portion comprises a subulate head.

7. An apparatus, comprising:
  a resilient mounting panel, the resilient mounting panel comprising a panel body and a mounting protrusion;
  an electronic device, an inserting opening defined in the electronic device;
  a connector, the connector comprising a connector body and a mounting portion extending from the connector body; the connector body comprises an inserting terminal configured to be received in the inserting opening; and the mounting portion is configured to be secured to the mounting protrusion and keep a distance from the panel body;
  wherein a through hole is defined in the mounting portion; the mounting protrusion comprises a protrusion body extending from the panel body and a positioning portion extending from the protrusion body; a cross section of the positioning portion is less than that of the protrusion body; and the positioning portion is received in the through hole to enable the protrusion body to contact the mounting portion.

8. The apparatus of claim 7, wherein a securing hole is defined in the mounting protrusion; and a securing element is screwed into the through hole and the securing hole to secure the connector to the mounting protrusion.

9. The apparatus of claim 7, wherein the resilient mounting panel further comprises a second mounting protrusion, and the connector further comprises a second mounting portion corresponding to the second mounting protrusion; and the mounting protrusion and the second mounting protrusion are disposed on opposite sides of the connector body.

10. The apparatus of claim 7, wherein the connector body is configured to connect to the electronic device in a direction substantially parallel to the panel body.

11. The apparatus of claim 7, wherein the connector body comprises a connecting terminal; the connecting terminal is configured to connect to a cable in a first direction, and the connector body is configured to connect to the electronic device in a second direction that is substantially perpendicular to the first direction.

12. The apparatus of claim 7, wherein the connector body further comprises a guiding portion disposed on one side of the inserting terminal, and a guiding cutout is defined in one side of the inserting opening corresponding to the guiding portion.

13. The apparatus of claim 12, wherein the guiding portion comprises a subulate head.

* * * * *